(12) United States Patent
Taniguchi et al.

(10) Patent No.: US 11,133,646 B2
(45) Date of Patent: Sep. 28, 2021

(54) SEMICONDUCTOR OPTICAL DEVICE AND OPTICAL TRANSCEIVER MODULE

(71) Applicant: Lumentum Japan, Inc., Kanagawa (JP)

(72) Inventors: Takafumi Taniguchi, Tokyo (JP); Shigenori Hayakawa, Kanagawa (JP); Yasushi Sakuma, Tokyo (JP)

(73) Assignee: Lumentum Japan, Inc., Kanagawa (JP)

( * ) Notice: Subject to any disclaimer, the term of this patent is extended or adjusted under 35 U.S.C. 154(b) by 148 days.

(21) Appl. No.: 16/419,043

(22) Filed: May 22, 2019

(65) Prior Publication Data
US 2020/0044417 A1 Feb. 6, 2020

(30) Foreign Application Priority Data

Aug. 2, 2018 (JP) .............................. JP2018-145785

(51) Int. Cl.
*H01S 5/026* (2006.01)
*H01S 5/22* (2006.01)
(Continued)

(52) U.S. Cl.
CPC .......... *H01S 5/0265* (2013.01); *H01S 5/2224* (2013.01); *H01S 5/2235* (2013.01); *H01S 5/0064* (2013.01); *H01S 5/0085* (2013.01); *H01S 5/02251* (2021.01); *H01S 5/02253* (2021.01); *H01S 5/02325* (2021.01); *H01S 5/02415* (2013.01); *H01S 5/06804* (2013.01);
(Continued)

(58) Field of Classification Search
CPC .... H01S 5/2235; H01S 5/2275; H01S 5/0207; H01S 5/22–2277; H01S 5/2205; H01S 5/2222; H01S 5/2224; H01S 5/2226; H01S 5/2234–2235
See application file for complete search history.

(56) References Cited

U.S. PATENT DOCUMENTS 5,723,360 A * 3/1998 Iwasaki ............ H01L 21/30612
117/93
5,936,990 A * 8/1999 Nakamura ............ B82Y 20/00
372/45.01
(Continued)

FOREIGN PATENT DOCUMENTS

JP 2012-019053 A 1/2012
JP 2013-061632 A 4/2013

*Primary Examiner* — Tod T Van Roy
*Assistant Examiner* — Sean P Hagan
(74) *Attorney, Agent, or Firm* — Harrity & Harrity, LLP

(57) ABSTRACT

The upper surface of the semiconductor substrate has a slope descending from the projection in the second direction at an angle of 0-12° to a horizontal plane. The mesa stripe structure has an inclined surface with a slope ascending from the upper surface of the semiconductor substrate at an angle of 45-55° to the horizontal plane, the mesa stripe structure having an upright surface rising from the inclined surface at an angle of 85-95° to the horizontal plane. The buried layer is made from semiconductor with ruthenium doped therein and is in contact with the inclined surface and the upright surface. The inclined surface is as high as 80% or less of height from the upper surface of the semiconductor substrate to a lower surface of the quantum well layer and is as high as 0.3 μm or more.

20 Claims, 6 Drawing Sheets

(51) Int. Cl.
*H01S 5/223* (2006.01)
*H01S 5/227* (2006.01)
*H01S 5/343* (2006.01)
*H01S 5/12* (2021.01)
*H01S 5/0683* (2006.01)
*H01S 5/068* (2006.01)
*H01S 5/024* (2006.01)
*H01S 5/02251* (2021.01)
*H01S 5/02253* (2021.01)
*H01S 5/02325* (2021.01)
*H01S 5/00* (2006.01)

(52) U.S. Cl.
CPC ....... *H01S 5/06832* (2013.01); *H01S 5/06837* (2013.01); *H01S 5/1231* (2013.01); *H01S 5/2275* (2013.01); *H01S 5/34306* (2013.01); *H01S 2301/176* (2013.01)

(56) References Cited

U.S. PATENT DOCUMENTS

| | | | |
|---|---|---|---|
| 5,956,358 A * | 9/1999 | Sasaki | B82Y 20/00 |
| | | | 372/45.01 |
| 2003/0067010 A1 * | 4/2003 | Iga | H01S 5/227 |
| | | | 257/103 |
| 2005/0030997 A1 * | 2/2005 | Tanaka | H01S 5/4031 |
| | | | 372/46.01 |
| 2005/0275053 A1 * | 12/2005 | Shimizu | G02B 6/132 |
| | | | 257/446 |
| 2012/0008895 A1 | 1/2012 | Sumi et al. | |
| 2013/0051725 A1 | 2/2013 | Shinoda et al. | |
| 2017/0250521 A1 * | 8/2017 | Nakamura | H01S 5/1064 |

* cited by examiner

SEMICONDUCTOR OPTICAL DEVICE AND OPTICAL TRANSCEIVER MODULE

CROSS-REFERENCE TO RELATED APPLICATION

The present application claims priority from Japanese application JP2018-145785 filed on Aug. 2, 2018, the content of which is hereby incorporated by reference into this application.

BACKGROUND OF THE INVENTION

1. Field of the Invention

This relates to semiconductor optical devices and optical transceiver modules.

2. Description of the Related Art

Recently, along with popularization of mobile devices and internet-communication devices, speeding up and greater capacity are required for optical transceivers. To modulate continuous light emitted from an oscillator, electric field absorption modulators [electro-absorption (EA) modulators] are used. The EA modulators are widely used due to small sizes and lower costs, in addition to its advantageous characteristics such as small chirp (wave modulation) of the modulators, large extinction ratio of difference between ON and OFF levels of an optical signal, and broadband.

JP 2012-19053A discloses an EA modulator-integrated optical semiconductor device in which an EA modulator in a buried heterostructure (hereinafter referred to as BH structure) is integrated. The BH structure is a structure where a semi-insulating semiconductor layer is buried on both sides of a mesa stripe structure in multiple layers including an active layer. Formation processes of the mesa stripe structure are disclosed in JP 2013-61632A.

To improve the characteristics of the EA modulator, the broadband is important: the broadband can be realized by reduction of parasitic capacitance in the EA modulator. The reduction of the parasitic capacitance can be realized by forming the buried layer thick or forming the high mesa stripe structure high in the EA modulator. However, the buried layer may be abnormally formed: voids are formed therein.

Mutual diffusion with dopant, such as zinc (Zn) in a p-type clad layer, can be minimized by adding Ru as an impurity in the buried layer, whereby high-speed response can be realized. However, formation of the buried layer with the Ru added should be carried out in a low temperature to lower its resistance.

SUMMARY OF THE INVENTION

This is to aim at preventing characteristic deterioration of optical semiconductor devices.

(1) A semiconductor optical device in a mesa stripe type includes a semiconductor substrate with a projection in a stripe shape extending in a first direction, the projection constituting at least a lower edge portion of a mesa stripe structure; a quantum well layer in a stripe shape extending in the first direction and on the projection, the quantum well layer constituting a part of the mesa stripe structure; and a buried layer adjacent to both sides of the mesa stripe structure in a second direction perpendicular to the first direction, on an upper surface of the semiconductor substrate, the buried layer constituting a buried heterostructure. The upper surface of the semiconductor substrate has a slope descending from the projection in the second direction at an angle of 0-12° to a horizontal plane. The mesa stripe structure has an inclined surface with a slope ascending from the upper surface of the semiconductor substrate at an angle of 45-55° to the horizontal plane, the mesa stripe structure having an upright surface rising from the inclined surface at an angle of 85-95° to the horizontal plane. The buried layer is made from semiconductor with ruthenium doped therein and is in contact with the inclined surface and the upright surface. The inclined surface is as high as 80% or less of height from the upper surface of the semiconductor substrate to a lower surface of the quantum well layer and is as high as 0.3 µm or more.

The inclined surface of the mesa stripe structure is a gentle upslope from the upper surface of the semiconductor substrate, making it easy to form the buried layer as expected, preventing characteristic deterioration of the semiconductor optical device.

(2) The semiconductor optical device according to (1), the quantum well layer may be a multiple quantum well layer and may include some quantum well layers and a barrier layer between adjacent two of the quantum well layers.

(3) In the semiconductor optical device according to (1) or (2), the projection of the semiconductor substrate may have a surface including all the inclined surface.

(4) In the semiconductor optical device according to (3), the surface of the projection of the semiconductor substrate may include a lower edge portion of the upright surface in the mesa stripe structure.

(5) In the semiconductor optical device according to any one of (1) to (4), the mesa stripe structure may include a clad layer in a stripe shape extending in the first direction on the quantum well layer, and the clad layer may be made from semiconductor with zinc doped therein.

(6) In the semiconductor optical device according to any one of (1) to (5), the mesa stripe structure may include a first mesa stripe structure where the quantum well layer is an active layer for constituting a semiconductor laser, the mesa stripe structure may include a second mesa stripe structure where the quantum well layer is an absorption layer for constituting a modulator, and the semiconductor optical device may be configured to be a modulator-integrated laser where the semiconductor laser and the modulator are monolithically integrated.

(7) An optical transceiver module includes a transmitter optical subassembly for outputting optical signals converted from input electric signals; and a receiver optical subassembly for outputting electric signals converted from input optical signals. At least the transmitter optical subassembly may be equipped with the semiconductor optical device according to any one of (1) to (6).

DETAILED DESCRIPTION OF THE INVENTION

Figure 1:
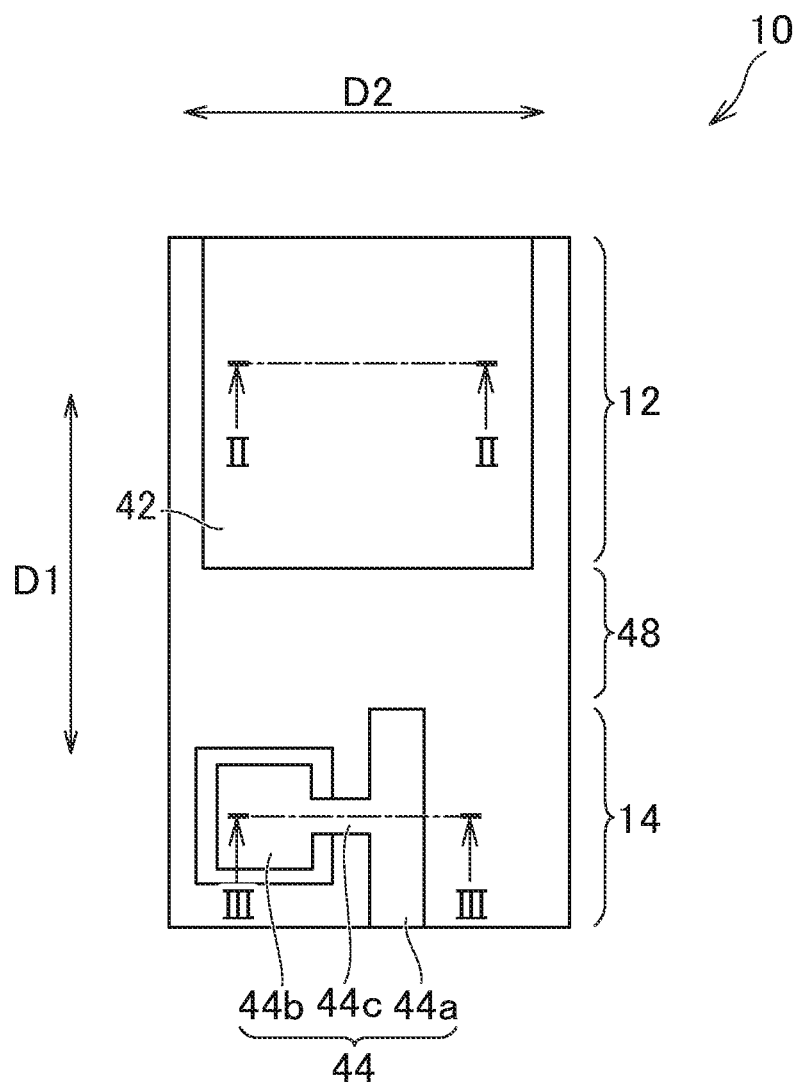
FIG. 1 is a plan view of a semiconductor optical device in an embodiment.

Hereinafter, some embodiments will be described specifically and in detail with reference to drawings. In all the drawings to explain the embodiments, the members with the identical or same function bear the same reference numerals, and their repetitive description will be omitted. The drawings used below are only to explain examples in the embodiments, sizes of figures do not always comply with magnification in the examples.

Figure 2:
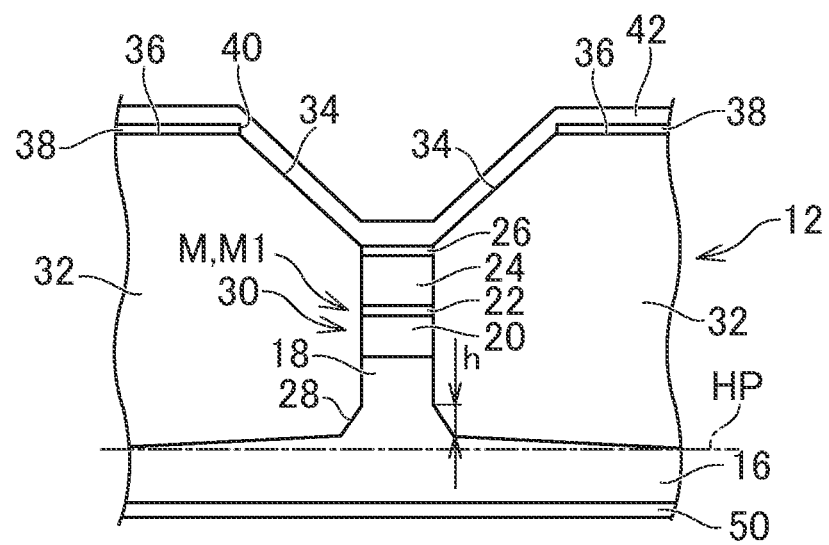
FIG. 2 is a II-II line cross-sectional view of the semiconductor optical device in FIG. 1.
Figure 3:
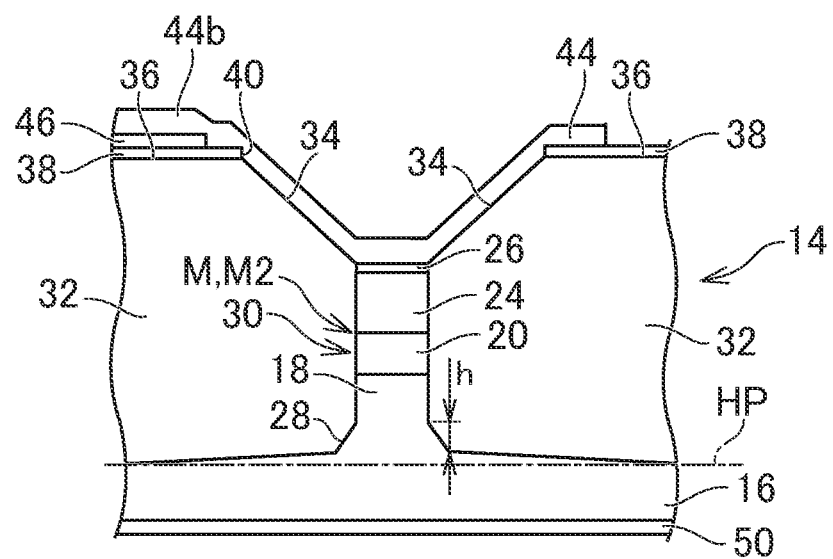
FIG. 3 is a III-III line cross-sectional view of the semiconductor optical device in FIG. 1.

FIG. 1 is a plan view of a semiconductor optical device in an embodiment. The semiconductor optical device 10 is configured to emit continuous light by a drive current injected into an oscillator portion 12, modulate it at a modulator portion 14, and output signal light. The semiconductor optical device 10 is a modulator-integrated semiconductor optical device (e.g. modulator-integrated laser) where the oscillator portion (e.g. semiconductor laser) and a modulator portion 14 are monolithically integrated in the same semiconductor substrate 16 (FIGS. 2 and 3). The oscillator portion 12 is a distributed feedback (DFB) semiconductor laser (DFB laser). The modulator portion 14 is one of electric field absorption modulators [electro-absorption (EA) modulators]. The electric field absorption modulators are widely used because of small sizes and lower costs, in addition to advantageous characteristics such as small chirp (wave modulation), large extinction ratio of difference between ON and OFF levels of an optical signal, and broadband. The modulator length is 100 μm. The semiconductor optical device 10 is one of EA modulator-integrated DFB laser elements. The EA modulator-integrated DFB laser elements may be used for optical transmission in a zone of 1.55 μm at a transmission speed of 40 Gbps or in a zone of 1.3 μm at a transmission speed of 25 Gbps.

FIG. 2 is a II-II line cross-sectional view of the semiconductor optical device 10 in FIG. 1. FIG. 3 is a III-III line cross-sectional view of the semiconductor optical device 10 in FIG. 1.

The semiconductor optical device 10 has a buried heterostructure (BH structure). The BH structure is a structure where a mesa stripe structure M with an optical waveguide has a semi-insulating semiconductor layer buried on both sides. The BH structure is widely used, having advantages such as high coupling efficiency with an optical fiber because of large optical confinement effect in a lateral direction and a more circular shape of far field pattern (FFP), additionally with superior heat dissipation.

The semiconductor optical device 10 has the semiconductor substrate 16. The semiconductor substrate 16 is made from semiconductor (e.g. n-type InP) where n-type impurities are doped. The semiconductor substrate 16 has a projection 18. The projection 18 extends in a first direction D1 to be in a stripe shape. The semiconductor substrate 16 has an upper surface sloping down in a second direction D2 from the projection 18, at an angle of 0-12° with respect to a horizontal plane HP. The projection 18 constitutes at least a lower edge portion of the mesa stripe structure M. The mesa stripe structure M includes a first mesa stripe structure M1 for the oscillator portion 12 (semiconductor laser). The mesa stripe structure M includes a second mesa stripe structure M2 for the modulator portion 14.

The semiconductor optical device 10 has a quantum well layer 20 extending in the first direction D1 on the projection 18 to be in a stripe shape. The quantum well layer 20 is made from intrinsic semiconductor where no impurities in p-type or n-type are doped. The quantum well layer 20, in a multiple quantum well structure, has a layer thickness of 0.35 μm in total. The quantum well layer 20 constitutes a part of the mesa stripe structure M. The quantum well layer 20, in a semiconductor laser (first mesa stripe structure M1), is an active layer. In the modulator portion 14 (second mesa stripe structure M2), the quantum well layer 20 is an absorption layer. The quantum well layer 20 is a multiple quantum well (MQW) layer. Applying an electric field into the MQW layer brings about a quantum-confined Stark effect (QCSE): an optical absorption edge in the MQW layer shifts to a long wavelength side. The EA modulator modulates light by utilizing the QCSE. The MQW layer includes strained quantum well layers (InGaAsP) and a barrier layer interposed between an adjacent pair of the quantum well layers.

An optical guide layer (not shown) made from InGaAsP is provided over and under the quantum well layer 20. The oscillator portion 12 has a grating layer on the quantum well layer 20 (active layer). The grating layer 22 is made from InGaAsP. The mesa stripe structure M includes a clad layer 24 extending in the first direction D1 on the quantum well layer 20 (grating layer 22 of the oscillator portion 12) to be in a stripe shape. The clad layer 24 is made from semiconductor (p-type InP) where zinc (Zn), p-type impurities, is doped. The mesa stripe structure M includes a contact layer 26. The contact layer 26 includes a p-type InGaAsP layer and a p-type InGaAs layer, each of which has p-type impurities (Zn) doped therein.

The mesa stripe structure M has an inclined surface 28 sloping up from an upper surface of the semiconductor substrate 16 at an angle of 45-55° with respect to the horizontal plane HP. The inclined surface 28 has a height h of 0.3 μm or more. The height h of the inclined surface 28 is as great as 80% or less of height from the upper surface of the semiconductor substrate 16 to a lower surface of the quantum well layer 20. The whole inclined surface 28 is a part of a surface of the projection 18 of the semiconductor substrate 16. The mesa stripe structure M has an upright surface 30 rising from the inclined surface 28 at an angle of 85-95° with respect to the horizontal plane HP. A lower edge portion of the upright surface 30 is included in the surface of the projection 18 of the semiconductor substrate 16.

The semiconductor optical device 10 has a buried layer 32. The buried layer 32 is made from semiconductor (e.g. n-type InP) where ruthenium (Ru) is doped. The InP in which the Ru is added is a semi-insulating semiconductor. The buried layer 32 is on the upper surface of the semiconductor substrate 16. The buried layer 32 is adjacent to both sides of the mesa stripe structure M, in a second direction D2 perpendicular to the first direction D1, thereby constituting a buried heterostructure. The semiconductor optical device 10 is in a mesa stripe type. The buried layer 32 is in contact with the inclined surface 28 and the upright surface 30 of the mesa stripe structure M.

The upper surface of the buried layer 32 is adjacent to an upper surface of the mesa stripe structure M, having an inclined portion 34 sloping along an orientation of a (111) plane. The upper surface of the buried layer 32 has a flat portion 36, extending parallel to the horizontal plane HP, outside the inclined portion 34.

In the embodiment, the mesa stripe structure M has the inclined surface 28 gently sloping up from the upper surface of the semiconductor substrate 16, whereby the buried layer 32 can be easily made properly, preventing characteristic deterioration of the semiconductor optical device 10.

The mesa stripe structure M and the buried layer 32 is covered with a passivation film 38. The passivation film 38 has a through-hole 40. In the through-hole 40, the upper surface of the mesa stripe structure M (contact layer 26) is exposed and an adjoining part (inclined portion 34) of the upper surface of the buried layer 32 is exposed. An electrode of the oscillator portion 12 and an electrode 44 of the modulator portion 14 are on the passivation film 38. The electrodes 42, 44 are electrically connected to the contact layer 26 in the through-hole 40. The electrode includes an extended portion 44a, a pad portion 44b, and a connection portion 44c. Between the pad portion 44b and the passivation film 38, for reducing parasitic capacitance, an insulating film 46 is formed from $SiO_2$. The semiconductor optical device 10 has an antireflective film (not shown) on an edge surface where light emits, and has a highly reflective film (not shown) on an opposite edge surface.

During manufacturing processes of the semiconductor optical device 10, first crystal growth is carried out for forming the first mesa stripe structure M1 in FIG. 2. Specifically, on the semiconductor substrate 16, the optical guide layer, the quantum well layer 20 (active layer), and the grating layer 22 are formed by metal-organic chemical vapor deposition (Mo-CVD). The quantum well layer 20 (MQW layer) is formed by alternately laminating a well layer and a barrier layer that are made from InGaAsP. The well layer is made strained. The InGaAsP composition of the MQW layer is adjusted, for the quantum well layer 20 (active layer) of the oscillator portion 12 to have its photoluminescence wavelength at about 1555 nm.

Then, an unillustrated silicon nitride film (SiN film) is formed by plasma chemical vapor deposition (plasma CVD) and is patterned to leave a portion of the SiN film in an area for the first mesa stripe structure M1, followed by dry etching and wet etching using the SiN film as an etching mask.

During the manufacturing processes of the semiconductor optical device 10, second crystal growth is carried out for forming the second mesa stripe structure M2 in FIG. 3. Specifically, on the semiconductor substrate 16, the optical guide layer and the quantum well layer 20 (absorption layer) are formed by Mo-CVD. The InGaAsP composition of the MQW layer is adjusted, for the quantum well layer 20 (absorption layer) of the modulator portion 14 to have its photoluminescence wavelength at about 1495 nm. InGaAsp-based materials are used for the quantum well layer 20 of the modulator portion 14, whereas InGaAlAs-based materials may be used.

Then, the SiN film is formed by plasma CVD and is patterned to leave a portion of the SiN film in an area for the first mesa stripe structure M1 and the second mesa stripe structure M2, followed by dry etching and wet etching using the SiN film as an etching mask.

During the manufacturing processes of the semiconductor optical device 10, third crystal growth is carried out to form a multi-layer structure of a waveguide portion 48 between the oscillator portion 12 and the modulator portion 14. Specifically, an InGaAsP layer, for a passive optical waveguide, has its crystals grown between the oscillator portion 12 and the modulator portion 14. Publicly known butt joints are employed for optical connection between the oscillator portion 12 and the waveguide portion 48, and between the modulator portion 14 and the waveguide portion 48.

Then, gratings are formed on the grating layer 22 of the oscillator portion 12, by an interference exposure process.

After forming the gratings, the clad layer 24 and the contact layer 26 are formed, for constituting a part of each of the oscillator portion 12, the waveguide portion 48, and the modulator portion 14. Zn is used for impurities as p-type dopant.

Then, over the mesa stripe structure M, including the oscillator portion 12, the waveguide portion 48, and the modulator portion 14, a silicon oxide film ($SiO_2$ film) is formed, followed by dry etching or wet etching using the $SiO_2$ film as an etching mask, to remove even a surface layer of the semiconductor substrate 16, whereby the mesa stripe structure M is formed to have its width of 1.3 μm. For example, the surface layer of the semiconductor substrate 16 is removed, up to 1.8 μm below the lower surface of the quantum well layer 20.

Subsequently, to form an inclined surface 28 at a lower part of the mesa stripe structure M, mass transport phenomenon by heat treatment is made caused. Temperature and time of the heat treatment is, for example, 650° C. and 5 minutes, approximately. This makes it possible for phosphorus (P) atoms to detach from the surface of the semiconductor substrate 16, whereby surface diffusion of indium (In) atoms accelerate, deforming a solid surface to have minimum surface energy.

Figures 4A, 4B, 4C:
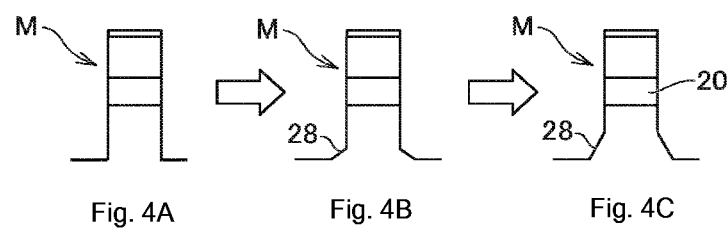
FIGS. 4A-4C are diagrams to show mass transport phenomenon.

FIGS. 4A-4C are diagrams to show mass transport phenomenon. FIGS. 4A-4C illustrate that the mass transport phenomenon forms the inclined surface 28 at the lower part of the mesa stripe structure M, forming the inclined surface 28 higher, with passage of heat treatment time. The heat treatment may serve as incitu Cl for diminishing damages of mesa surface portions. Hydrochloric acid-based wet etching can form a tapered portion in a fillet shape, when the mesa stripe structure M has a forward mesa shape before the heat treatment. The heat treatment is carried out until the inclined surface 28 is made as high as 80% or less of height from the upper surface of the semiconductor substrate 16 to the lower surface of the quantum well layer 20 and as high as 0.3 μm or more. Forming the inclined surface even over the quantum well layer may be a factor of current leakage. This makes it preferable, taking manufacturing variations of a whole wafer into consideration, to form the inclined surface as high as up to 80% or less of the height from the upper surface of the semiconductor substrate 16 to the lower surface of the quantum well layer 20. Making the inclined surface to be lower than 0.3 μm may impede enough formation of the buried layer 32 at the lower portion of the mesa stripe structure M, making it likely to form voids. This is why the tapered portion in a kind of fillet shape is necessary; the inventors found that 0.3 μm or more is preferable, as a result of intensive studies.

Subsequently, on the both sides of the mesa stripe structure M, the buried layer 32 is formed from InP where Ru is added as impurities, by MO-CVD. Crystal growth is carried out to make the buried layer 32 higher than the upper surface of the contact layer 26 of the mesa stripe structure M. The buried layer 32 may be formed after the incitu Cl for diminishing the damages of the surface of the mesa stripe structure M.

The embodiment, in the semiconductor optical device 10 with the BH structure, can prevent the buried layer 32 from growth abnormality such as voids, improving characteristics.

Additionally, of the contact layer 26, which is the uppermost layer of the mesa stripe structure M, an area of the waveguide portion 48 is removed. This electrically insulates the contact layer 26 of the modulator portion 14 from the contact layer 26 of the oscillator portion 12. This is why a trench, formed by the removal, is called an isolation trench.

After forming the isolation trench, the passivation film 38 is formed all over the surface of the wafer. Additionally, the insulating film 46 made from $SiO_2$ is formed to include an area, on which the pad portion 44b of the electrode 44 in the modulator portion is to be made. The insulating film 46 reduces parasitic capacitance. Then, the through-hole 40 is formed by wet etching in the passivation film 38, by partially removing each of areas to be the oscillator portion 12 and the modulator portion 14. The respective electrodes 42, 44 are formed by electron beam (EB) vapor deposition method and ion milling, to cover the through-hole 40 of each of the oscillator portion 12 and the modulator portion 14.

Then, the lower surface of the wafer is polished until the wafer is about 100 μm in thickness, and the electrode 50 is formed, finalizing the wafer processes. Furthermore, the wafer is cleaved into rod shapes, the antireflective film is formed on the edge surface on the side of the modulator portion 14, the highly reflective film is formed on the edge surface on the side of the oscillator portion, and the semiconductor optical devices 10 are completed after cleavage into chips.

Figure 5:
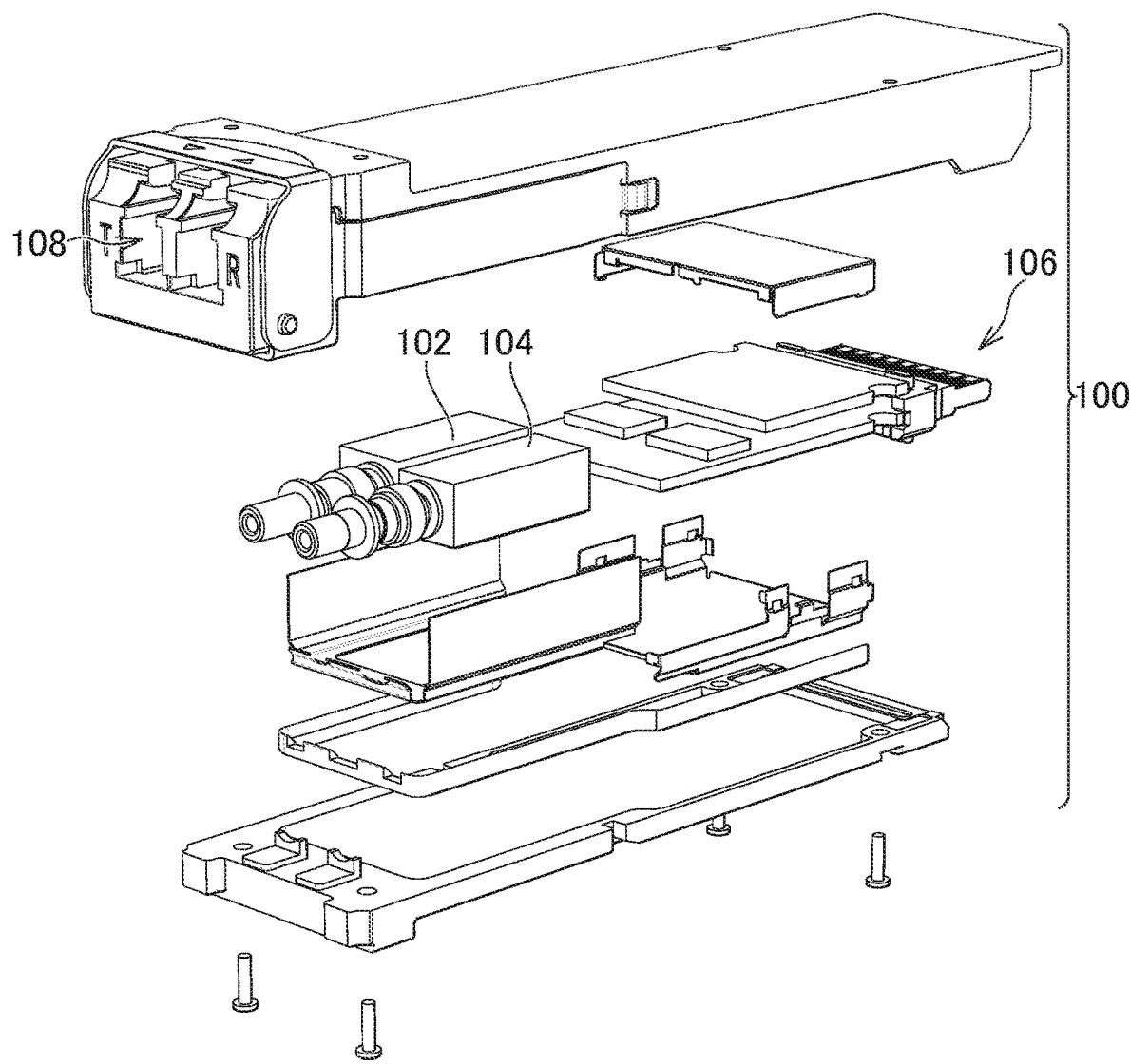
FIG. 5 is an exploded perspective view of an optical transceiver module in the embodiment.

FIG. 5 is an exploded perspective view of an optical transceiver module in the embodiment. The optical transceiver module 100 has a transmitter optical subassembly 102 (TOSA) for converting an electric signal into an optical signal, and a receiver optical subassembly 104 (ROSA) for converting an optical signal into an electric signal. On the transmission side, the electric signal from an unillustrated host substrate passes through an electrical interface 106, passes through a circuit in the optical transceiver module 100, and is converted into the optical signal to be transmitted from an optical interface 108. On the reception side, the optical signal is received from the optical interface 108, and the electric signal is output from the electrical interface 106 to a substrate on the unillustrated host side.

Figure 6:
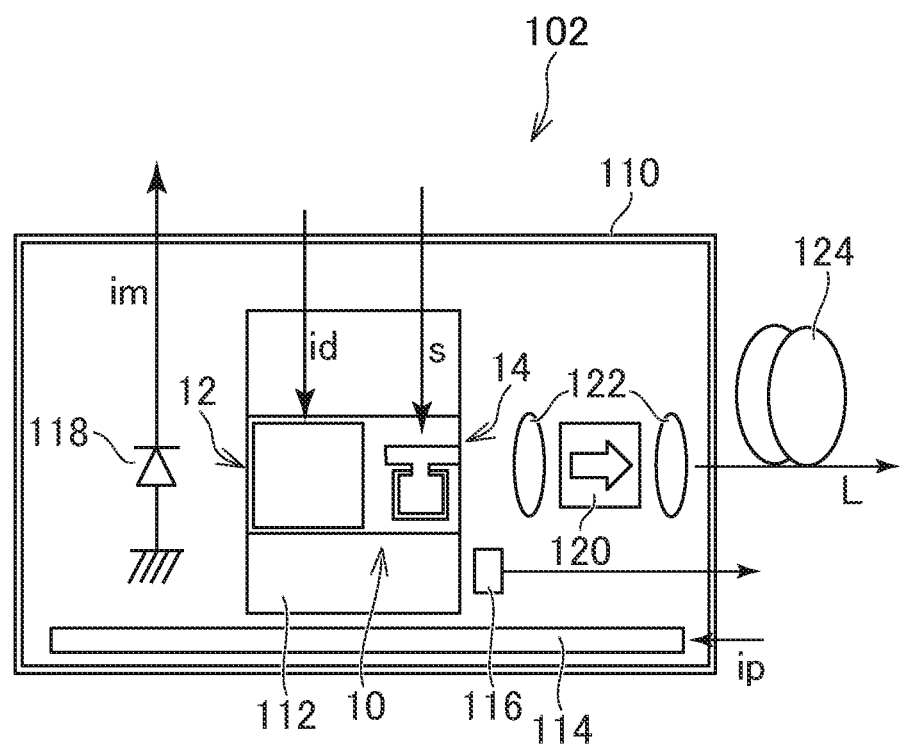
FIG. 6 is a schematic view of an interior of a transmitter optical subassembly in the embodiment.

FIG. 6 is a schematic view of an interior of the transmitter optical subassembly 102 in the embodiment. The transmitter optical subassembly 102 has a package 110. The package 110 is made of metal materials and processed into a box type. The package 110 consists of components such as a bottom plate made from highly thermally conductive CuW alloys, a frame made from FeNi alloys, a ceramic feed-through with an interconnect pattern for transmitting electric signals into the package 110, lead terminals, a seam ring for seam welding of a cap, sapphire glass for hermetically sealing a light-extraction window, and pipe members for fixing a lens holder and an optical fiber by welding; these are assembled using bonding materials such as brazing filler and AuSu solder.

The transmitter optical subassembly 102 has the semiconductor optical device 10, as mentioned above. The semiconductor optical device 10 is mounted on a chip carrier 112, made from aluminum nitride (AlN), with a 50Ω terminal resistor, using AuSu solder or brazing filler. The chip carrier 112 is mounted on an upper side of a Peltier element 114, temperature adjustment means, in the package 110. A thermistor 116, a monitor photodiode 118, an optical isolator 120, and a collective lens 122 are additionally installed in the package 110. The collective lens 122 is a lens for condensing light toward an optical fiber 124 connected to a light exit.

Outside the transmitter optical subassembly 102, control means (not shown) are provided, to carry out an auto power control (APC) to the transmitter optical subassembly 102. Specifically, the highly reflective film, on the edge surface closer to the oscillator portion 12 of the semiconductor optical device 10, is formed to partially pass light; the monitor photodiode 118 receives rear output light from a rear end surface of the semiconductor optical device 10, outputting it as a monitor current $i_m$ to the control means. In response to the monitor current $i_m$, a laser drive current $i_d$ is supplied to the oscillator portion 12 of the semiconductor optical device 10. By the APC, output light L from the transmitter optical subassembly 102 can keep its constant output power. A modulator drive signal S is supplied to the modulator portion 14 of the semiconductor optical device 10.

By unillustrated control means, auto temperature control (ATC) is carried out to the transmitter optical subassembly 102. Specifically, temperature of the thermistor 116 and semiconductor optical device 10 is detected, and the temperature as monitor temperature T is output to the control means. In response to the monitor temperature T, a Peltier element drive current $i_p$ is supplied to the Peltier element 114. By the ATC control, the temperature of the semiconductor optical device 10 is kept constant.

To sum up, the transmitter optical subassembly 102 of the optical transceiver module 100 is explained, whereas the receiver optical subassembly 104 may include the semiconductor optical device 10, as mentioned above.

While there have been described what are at present considered to be certain embodiments, it will be understood that various modifications may be made thereto, and it is intended that the appended claims cover all such modifications as fall within the true spirit and scope of the invention.

What is claimed is:

1. A semiconductor optical device in a mesa stripe type, comprising:
   a semiconductor substrate with a projection in a stripe shape extending in a first direction,
      the projection constituting at least a lower edge portion of a mesa stripe structure;
   a quantum well layer in the stripe shape extending in the first direction and on the projection,
      the quantum well layer constituting a part of the mesa stripe structure; and
   a buried layer, adjacent to both sides of the mesa stripe structure in a second direction perpendicular to the first direction, on an upper surface of the semiconductor substrate,
      the buried layer constituting a buried heterostructure,
   wherein:
      the upper surface of the semiconductor substrate has a first slope descending from the projection in the second direction at an angle of 0-12° respective to a horizontal plane,
      the mesa stripe structure has an inclined surface with a second slope ascending from the upper surface of the semiconductor substrate at an angle of 45-55° respective to the horizontal plane,
      the mesa stripe structure has an upright surface rising from the inclined surface at an angle of 85-95° respective to the horizontal plane,
      the buried layer is made from a semiconductor with ruthenium doped therein and is in contact with the inclined surface and the upright surface,
      a height of the inclined surface is 80% or less of a height from the upper surface of the semiconductor substrate to a lower surface of the quantum well layer,
      the height of the inclined surface is 0.3 μm or more, and
      an area of the mesa stripe structure defined by a plane of the upper surface of the semiconductor substrate, a plane of the inclined surface, and a plane of the upright surface is recrystallized structure.

2. The semiconductor optical device according to claim 1, wherein the quantum well layer is a multiple quantum well layer that includes a barrier layer between two adjacent quantum well layers.

3. The semiconductor optical device according to claim 1, wherein a surface the projection includes an entirety of the inclined surface.

4. The semiconductor optical device according to claim 3, wherein the surface of the projection further includes an edge portion of the upright surface.

5. The semiconductor optical device according to claim 1, wherein:
the mesa stripe structure includes a clad layer in the stripe shape extending in the first direction on the quantum well layer, and
the clad layer is made from semiconductor with zinc doped therein.

6. The semiconductor optical device according to claim 1, wherein the mesa stripe structure is a first mesa stripe structure and the quantum well layer is an active layer for constituting a semiconductor laser,
wherein the semiconductor optical device further comprises:
a second mesa stripe structure comprising a quantum well layer that is an absorption layer for constituting a modulator, and
wherein the semiconductor optical device is configured to be a modulator-integrated laser where the semiconductor laser and the modulator are monolithically integrated.

7. An optical transceiver module, comprising:
a transmitter optical subassembly for outputting optical signals converted from input electric signals; and
a receiver optical subassembly for outputting electric signals converted from input optical signals,
wherein the transmitter optical subassembly comprises a semiconductor optical device comprising:
a semiconductor substrate with a projection in a stripe shape extending in a first direction,
the projection constituting at least a first portion of a mesa stripe structure;
a quantum well layer in the stripe shape extending in the first direction and on the projection,
the quantum well layer constituting a second portion of the mesa stripe structure; and
a buried layer, adjacent to both sides of the mesa stripe structure in a second direction perpendicular to the first direction, on an upper surface of the semiconductor substrate,
wherein:
the upper surface of the semiconductor substrate has a first slope descending from the projection in the second direction at an angle of 0-12° respective to a horizontal plane,
the mesa stripe structure has an inclined surface with a second slope ascending from the upper surface of the semiconductor substrate at an angle of 45-55° respective to the horizontal plane,
the mesa stripe structure has an upright surface rising from the inclined surface at an angle of 85-95° respective to the horizontal plane,
the buried layer is made from a semiconductor with ruthenium doped therein and is in contact with the inclined surface and the upright surface,
a height of the inclined surface is 80% or less of a height from the upper surface of the semiconductor substrate to a lower surface of the quantum well layer,
the height of the inclined surface is 0.3 µm or more, and
an area of the mesa stripe structure defined by a plane of the upper surface of the semiconductor substrate, a plane of the inclined surface, and a plane of the upright surface is recrystallized structure.

8. The optical transceiver module according to claim 7, wherein the quantum well layer is a multiple quantum well layer that includes a barrier layer between an adjacent pair of quantum well layers.

9. The optical transceiver module according to claim 7, wherein a surface of the projection includes an entirety of the inclined surface.

10. The optical transceiver module according to claim 9, wherein the surface of the projection further includes an edge portion of the upright surface.

11. The optical transceiver module according to claim 7, wherein the mesa stripe structure includes a clad layer on the quantum well layer.

12. The optical transceiver module according to claim 7, wherein the mesa stripe structure includes a first mesa stripe structure and the quantum well layer is an active layer for constituting a semiconductor laser,
wherein the semiconductor optical device further comprises:
a second mesa stripe structure comprising an absorption layer for constituting a modulator,
wherein the semiconductor laser and the modulator are monolithically integrated.

13. A method of manufacturing a semiconductor optical device, comprising:
forming a mesa stripe structure, the mesa stripe structure comprising:
a projection extending from a semiconductor substrate in a first direction,
wherein an upper surface of the semiconductor substrate has a first slope descending from the projection at an angle of 0-12° respective to a horizontal plane, and
a quantum well layer extending in the first direction and on the projection,
wherein the mesa stripe structure has an upright surface at an angle of 85-95° respective to the horizontal plane;
forming an inclined surface, of the mesa stripe structure, with a second slope ascending from the upper surface of the semiconductor substrate at an angle of 45-55° respective to the horizontal plane,
wherein an area of the mesa stripe structure defined by a plane of the upper surface of the semiconductor substrate, a plane of the inclined surface, and a plane of the upright surface is recrystallized structure; and
forming a buried layer, adjacent to both sides of the mesa stripe structure in a second direction perpendicular to the first direction, on the upper surface of the semiconductor substrate,
wherein the buried layer is in contact with the inclined surface and the upright surface.

14. The method according to claim 13, wherein forming the inclined surface comprises:
providing a heat treatment until:
a height of the inclined surface is 80% or less of a height from the upper surface of the semiconductor substrate to a lower surface of the quantum well layer, and
the height of the inclined surface is 0.3 µm or more.

15. The method according to claim 13, wherein forming the quantum well layer comprises:
forming a multiple quantum well layer including a barrier layer between an adjacent pair of quantum well layers.

16. The method according to claim 13, wherein a height of the buried layer is higher than a height of the mesa stripe structure.

17. The method according to claim 13, further comprising:
forming an isolation trench in the semiconductor optical device to electrically insulate a contact layer of the mesa stripe structure.

18. The method according to claim 17, further comprising:
forming, based on forming the isolation trench, a passivation film; and
forming an insulating film to reduce parasitic capacitance.

19. The method according to claim 13, wherein the mesa stripe structure includes a clad layer extending in the first direction on the quantum well layer.

20. The method according to claim 13, wherein the mesa stripe structure includes a first mesa stripe structure and the quantum well layer is an active layer for constituting a semiconductor laser,
wherein the semiconductor optical device further comprises:
a second mesa stripe structure where the quantum well layer is an absorption layer for constituting a modulator,
wherein the semiconductor laser and the modulator are monolithically integrated.

* * * * *